US010720531B2

(12) United States Patent
Gu et al.

(10) Patent No.: US 10,720,531 B2
(45) Date of Patent: Jul. 21, 2020

(54) THIN FILM TRANSISTOR AND METHOD FOR MANUFACTURING THE SAME, ARRAY SUBSTRATE AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Keke Gu, Beijing (CN); Ni Yang, Beijing (CN); Hui Li, Beijing (CN); Xin Liu, Beijing (CN)

(73) Assignees: Chongqing BOE Optoelectronics Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/345,204

(22) PCT Filed: Feb. 27, 2018

(86) PCT No.: PCT/CN2018/077333
§ 371 (c)(1),
(2) Date: Apr. 25, 2019

(87) PCT Pub. No.: WO2018/201781
PCT Pub. Date: Nov. 8, 2018

(65) Prior Publication Data
US 2019/0296152 A1    Sep. 26, 2019

(30) Foreign Application Priority Data
May 5, 2017    (CN) .......................... 2017 1 0316224

(51) Int. Cl.
*H01L 29/786* (2006.01)
*H01L 27/12* (2006.01)
(Continued)

(52) U.S. Cl.
CPC .... *H01L 29/78618* (2013.01); *H01L 27/1214* (2013.01); *H01L 29/0847* (2013.01);
(Continued)

(58) Field of Classification Search
CPC .......... H01L 29/78618; H01L 27/1214; H01L 29/0847; H01L 29/41733; H01L 29/42384; H01L 29/66765; H01L 27/1222
See application file for complete search history.

(56) References Cited

U.S. PATENT DOCUMENTS 9,196,735 B2 * 11/2015 Yang ................. H01L 29/41733
2015/0129882 A1 * 5/2015 Jiang ................. H01L 29/41733
257/72
2019/0296152 A1   9/2019 Gu et al.

FOREIGN PATENT DOCUMENTS

CN    103412449 A    11/2013
CN    204516772 U    7/2015
(Continued)

OTHER PUBLICATIONS

International Search Report and Written Opinion issued in International Application No. PCT/CN2018/077333, dated Jun. 5, 2018, with English translation.
(Continued)

*Primary Examiner* — Karen Kusumakar
(74) *Attorney, Agent, or Firm* — McDermott Will & Emery LLP (57) ABSTRACT

A thin film transistor includes a gate, an active layer, a source, a drain. The source includes a connecting portion, a first sub-portion, a second sub-portion, and a third sub-
(Continued)

portion that are arranged sequentially and in parallel. At first ends of the sub-portions, the connecting portion is connected to the portions to form two adjacent recesses. At second ends of the sub-portions, the distance from an end of the second sub-portion to the connecting portion is smaller than a distance from an end of the first sub-portion to the connecting portion and a distance from an end of the third sub-portion to the connecting portion. The drain includes a connecting block, a first drain and a second drain disposed in the two recesses respectively, and at least a portion of the connecting block is disposed between the first and the second drains to connect the first and the second drains.

16 Claims, 10 Drawing Sheets

(51) Int. Cl.
*H01L 29/08* (2006.01)
*H01L 29/417* (2006.01)
*H01L 29/423* (2006.01)
*H01L 29/66* (2006.01)

(52) U.S. Cl.
CPC .. *H01L 29/41733* (2013.01); *H01L 29/42384* (2013.01); *H01L 29/66765* (2013.01)

(56) References Cited

FOREIGN PATENT DOCUMENTS

| | | |
|---|---|---|
| CN | 105702683 A | 6/2016 |
| CN | 106992215 A | 7/2017 |
| JP | 2010-3723 A | 1/2010 |

OTHER PUBLICATIONS

First Office Action issued in Chinese Application No. 201710316224.7, dated May 5, 2019, with English translation.

* cited by examiner

THIN FILM TRANSISTOR AND METHOD FOR MANUFACTURING THE SAME, ARRAY SUBSTRATE AND DISPLAY DEVICE

CROSS-REFERENCE TO RELATED APPLICATION

This application is a national phase entry under 35 USC 371 of International Patent Application No. PCT/CN2018/077333 filed on Feb. 27, 2018, which claims priority to Chinese Patent Application No. 201710316224.7, filed with the Chinese Patent Office on May 5, 2017, titled "A THIN FILM TRANSISTOR, ARRAY SUBSTRATE AND DISPLAY DEVICE", which are incorporated herein by reference in their entirety.

TECHNICAL FIELD

The present disclosure relates to the field of display technologies, and in particular, to a thin film transistor and a method for manufacturing the same, an array substrate, and a display device.

BACKGROUND

In the field of display technologies, a thin film transistor (TFT) is an important device for manufacturing a display device, and plays an important role in a display quality of the display device. For example, each of sub-pixels arranged in an array in an array substrate of the display device generally includes at least one TFT. TFTs with a double U-shaped structure are widely used due to their large operating current.

SUMMARY

Embodiments of the present disclosure provide a thin film transistor, an array substrate, and a display device. Embodiments of the present disclosure adopt the following technical solutions:

In an aspect, embodiments of the present disclosure provide a thin film transistor, which includes a gate, an active layer, a source, and a drain. The source includes a connecting portion, and a first sub-portion, a second sub-portion, and a third sub-portion that are arranged sequentially. At first ends of the first, second, and third sub-portions, the connecting portion is connected to the first sub-portion, the second sub-portion, and the third sub-portion to form two recesses adjacent to each other, and wherein a distance from a second end of the second sub-portion to the connecting portion is smaller than a distance from a second end of the first sub-portion to the connecting portion and a distance from a second end of the third sub-portion to the connecting portion. The drain includes a connecting block, and a first drain and a second drain disposed in the two recesses respectively, wherein at least a portion of the connecting block is disposed between the first drain and the second drain, and is connected to the first drain and the second drain.

In some embodiments, the connecting block is entirely disposed between the first drain and the second drain, and an edge of the connecting block facing away from the connecting portion is in a same plane as edges of the first drain and the second drain facing away from the connecting portion.

In some embodiments, the gate has a hollow portion, and the hollow portion corresponds to the portion of the connecting block disposed between the first drain and the second drain.

In some embodiments, wherein in a plane parallel to any surface of the gate, in a direction that is perpendicular to a direction from one of the first ends to a corresponding second end, a size of the hollow portion is equal to a distance between an orthographic projection of the first drain and an orthographic projection the second drain.

In some embodiments, in a direction from one of the first ends to a corresponding second end, a size of the hollow portion is equal to a size of the portion of the connecting block disposed between the first drain and the second drain in the direction.

In some embodiments, the connecting block is entirely disposed between the first drain and the second drain, and an edge of the connecting block facing away from the connecting portion is in a same plane as edges of the first drain and the second drain facing away from the connection portion, in a direction from one of the first ends to a corresponding second end, an edge of the hollow portion facing away from the connecting portion extends beyond the edge of the connecting block facing away from the connecting portion, and an edge of the hollow portion close to the connecting portion extends beyond an edge of the connecting block close to the connection portion.

In some embodiments, the hollow portion is a gap disposed in a side of the gate close to the edge of the connecting block facing away from the connecting portion.

In some embodiments, orthographic projections of the source and the drain on a plane where the active layer is located are within a range of the active layer.

In some embodiments, a size of a portion of the connecting block that is not disposed between the first drain and the second drain in a direction perpendicular to a direction from one of the first ends to a corresponding second end is equal to a distance between a side of the first drain facing the second drain and a side of the second drain facing the first drain.

In some embodiments, a size of a portion of the connecting block that is not disposed between the first drain and the second drain in a direction perpendicular to a direction from one of the first ends to a corresponding second end is equal to a distance between a side of the first drain facing away from the second drain and a side of the second drain facing away from the first drain.

In another aspect, embodiments of the present disclosure further provide an array substrate, which is divided into sub-pixels arranged in an array. Each sub-pixel includes a pixel electrode and the thin film transistor described above, and the pixel electrode is connected to the connecting block of the thin film transistor.

In yet another aspect, embodiments of the present disclosure further provide a display device, which includes the array substrate described above.

BRIEF DESCRIPTION OF THE DRAWINGS

In order to describe technical solutions in embodiments of the present disclosure or in the related art more clearly, the accompanying drawings to be used in the description of embodiments or in the related art will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Embodiments of the present disclosure provide a thin film transistor, an array substrate, and a display device. The thin film transistor may increase an aperture ratio of a sub-pixel unit while ensuring that a ratio of width to length of a channel is kept the same when applied to the field of display.

Embodiments of the present disclosure provide a thin film transistor, an array substrate, and a display device. The thin film transistor includes a gate, an active layer, a source, and a drain. The source includes a connecting portion, and a first sub-portion, a second sub-portion, and a third sub-portion that are arranged sequentially and in parallel. At first ends of the sub-portions, the connecting portion is connected to the first sub-portion, the second sub-portion, and the third sub-portion to form two recesses (that is, two U-shapes) adjacent to each other. At second ends of the sub-portions, a distance from an end of the second sub-portion to the connecting portion is smaller than a distance from an end of the first sub-portion to the connecting portion and a distance from an end of the third sub-portion to the connecting portion. The drain includes a connecting block, and a first drain and a second drain disposed in the two recesses respectively. At least a portion of the connecting block is disposed between the first drain and the second drain to connect the first drain and the second drain.

Figure 1:
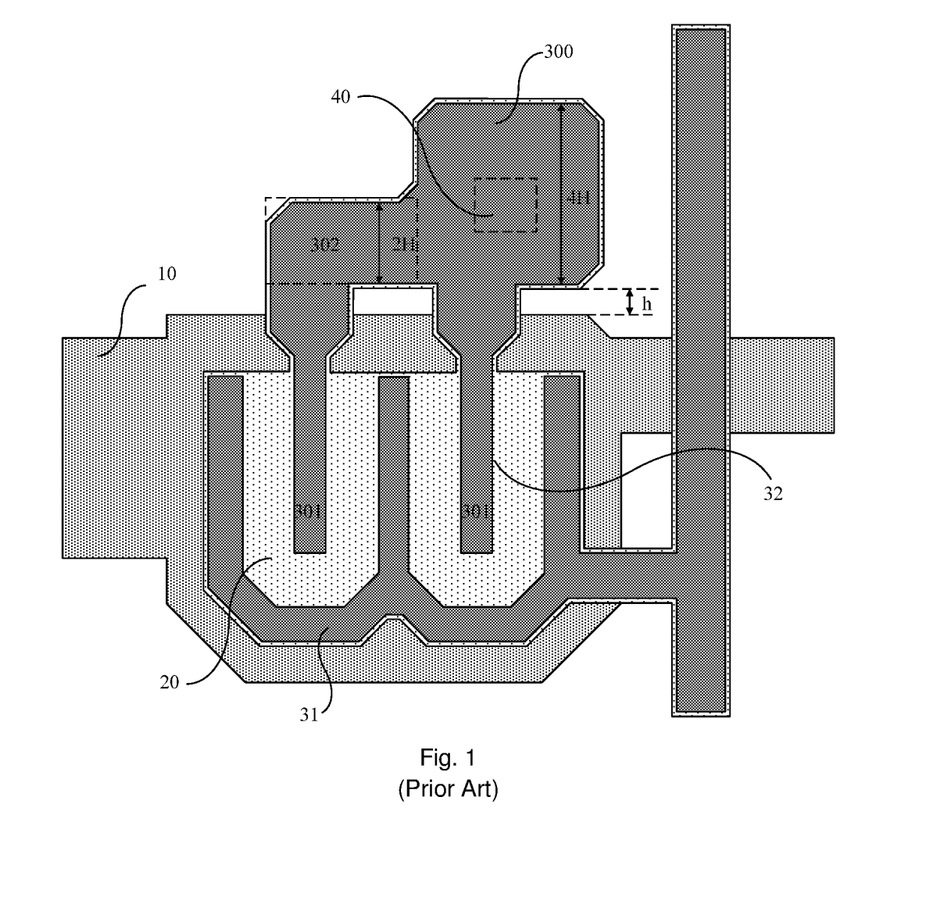
FIG. 1 is a schematic diagram showing a structure of a thin film transistor according to the related art.

FIG. 1 shows a thin film transistor (TFT) with a double U-shaped structure in an array substrate of a display device in the related art. The TFT includes a gate 10, an active layer 20, a source 31, and a drain 32. The source 31 of the TFT has a structure consisting of two U-shapes in parallel. The drain 32 includes two sub-portions 301 respectively disposed in two U-shaped recesses, and the two sub-portions 301 are connected by a connecting block 300. Generally, the connecting block 300 has a large area. Moreover, as shown in FIG. 2, the connecting block 300 is connected to a pixel electrode 50 through a via hole 40 disposed above the connecting block.

Figure 2:
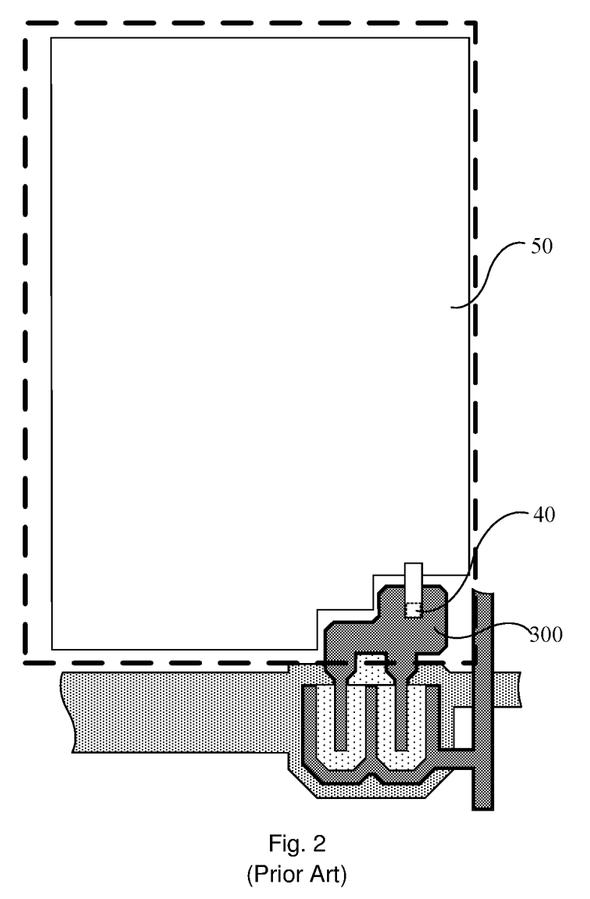
FIG. 2 is a schematic diagram showing a structure of a sub-pixel including the thin film transistor shown in FIG. 1 according to the related art.

However, as shown in FIG. 2, the connecting block 300 is disposed outside the gate 10, and is made of an opaque material. In this case, for a single sub-pixel, since an area of a corresponding connecting block 300 is large, an area of the pixel electrode 50 is relatively small, which means the aperture ratio of the sub-pixel unit is relatively small.

Figure 3:
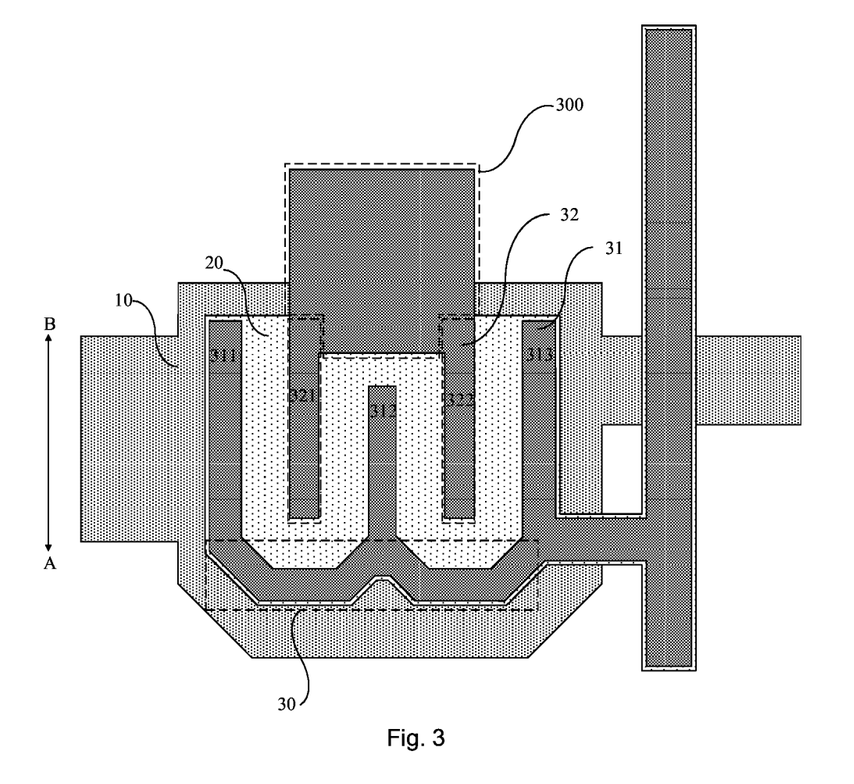
FIG. 3 is a schematic diagram showing a structure of a thin film transistor according to embodiments of the present disclosure.

Embodiments of the present disclosure provide a thin film transistor. As shown in FIG. 3, the thin film transistor includes a gate 10, an active layer 20, a source 31, and a drain 32. In some embodiments of the present disclosure, the thin film transistor may be of a top-gate type or a bottom-gate type. FIG. 3 is merely a schematic illustration by taking a bottom-gate type TFT as an example, but some embodiments of the present disclosure are not limited thereto. The following embodiments are all described by taking a bottom-gate type TFT as an example for further explanation.

The source 31 includes a connecting portion, and a first sub-portion, a second sub-portion, and a third sub-portion that are arranged sequentially and in parallel. At first ends A of the three sub-portions, the connecting portion is connected to the first sub-portion, the second sub-portion, and the third sub-portion to form two recesses (that is, two U-shapes) adjacent to each other. At second ends B of the sub-portions, a distance from an end of the second sub-portion 312 to the connecting portion 30 is smaller than a distance from an end of the first sub-portion 311 to the connecting portion 30 and a distance from an end of the third sub-portion 313 to the connecting portion 30.

It will be noted that, "at second ends B of the sub-portions, a distance from an end of the second sub-portion 312 to the connecting portion 30 is smaller than a distance from an end of the first sub-portion 311 to the connecting portion 30 and a distance from an end of the third sub-portion 313 to the connecting portion 30" refers to that: at the second ends B of the sub-portions, there is a distance between the end of the first sub-portion 311 and the end of the second sub-portion 312, and between the end of the third sub-portion 313 and the end of the second sub-portion 312; and the end of the second sub-portion 312 is closer to the connecting portion 30 than the end of the first sub-portion 311 and the end of the third sub-portion 313. That is, the end of the first sub-portion 311 and the end of the third sub-portion 313 protrude beyond the end of the second sub-portion 312.

The drain 32 includes a connecting block 300, and a first drain 321 and a second drain 322 disposed in the two recesses respectively. At least a portion of the connecting block 300 is disposed between the first drain 321 and the second drain 322 to connect the first drain 321 and the second drain 322.

It will be noted that, first, "the first drain 321 and the second drain 322 of the drain 32" refer to portions of the drain 32 that are at least opposite to the sub-portions of the source 31, as shown in FIG. 3, that is, portions capable of performing effective carrier transport with sub-portions of the source 31 in an operating state.

Second, the source 31 and the drain 32 serve as a signal input electrode and a signal output electrode, respectively. The source 31 may serve as a signal input electrode and the drain 32 may serve as a signal output electrode. For example, in a display panel, the source 31 connected to a data line is used as a signal input electrode, and a drain 32 connected to a pixel electrode is used as a signal output electrode. Of course, the drain 32 may serve as a signal input electrode and the source 31 may serve as a signal output electrode, which is not limited by some embodiments of the present disclosure. Some embodiments of the present disclosure are illustrated by taking an example in which the source 31 is used as a signal input electrode, and the drain 32 is used as a signal output electrode.

Third, in some embodiments of the present disclosure, a size of a portion of the connecting block 300 that is not disposed between the first drain 321 and the second drain 322 in a direction perpendicular to the direction from the first end A to the second end B may be equal to a distance between an inner side of the first drain 321 and an inner side of the second drain 322, or may be equal to, as shown in FIG. 3, a distance between an outer side of the first drain 321 and an outer side of the second drain 322, which is not limited by some embodiments of the present disclosure, as long as it is ensured that the size of the connecting block 300 meets requirements for subsequent connection.

Fourth, as shown in FIG. 3, since the first drain 321 and the second drain 322 refer to portions of the drain 32 that are opposite to the sub-portions of the source 31 (referring to "first"), on this basis, it will be understood by those skilled in the art that, the at least a portion of the connecting block 300 disposed between the first drain 321 and the second drain 322 refers to, as shown in FIG. 3, a portion of the connecting block 300 disposed in a region opposite to a region between the first drain 321 and the second drain 322. That is, a projection of this portion will fall within the gate 10. And the portion of the connecting block 300 that is not disposed between the first drain 321 and the second drain 32 (referring to "third") refers to a portion of the connecting block 300 disposed outside the region opposite to the region between the first drain 321 and the second drain 322.

In summary, at the second ends of the sub-portions, the distance from the end of the second sub-portion to the connecting portion is smaller than the distance from the end of the first sub-portion to the connecting portion and the distance from the third sub-portion to the connecting portion. Moreover, at least a portion of the connecting block is disposed between the first drain and the second drain to connect the first drain and the second drain. That is, the connecting block and the gate overlap in the region between the first drain and the second drain. Based on this, compared with the double U-shaped TFT in the related art, in which the first sub-portion, the second sub-portion, and the third sub-portion are of the same length, and the connecting block is entirely disposed outside the gate, the technical solution provided by some embodiments of the present disclosure may be viewed as, for example, a distance by which the first sub-portion and the third sub-portion are lengthened is the same as a distance by which the second sub-portion is shortened, on the basis of the related art. Moreover, the connecting block is moved toward the source by a distance the same as the distance by which the above sub-portions are lengthened or shortened, so that at least a portion of the connecting block is disposed between the first drain and the second drain to connect the first drain and the second drain.

Moreover, in a case where other conditions are kept the same, some embodiments of present disclosure not only ensure that the width to length ratio of a channel is kept the same as that in the TFT provided in the related art, but also make sure that the aperture ratio is reduced by an amount due to lengthening of the first sub-portion and the third sub-portion smaller than an amount by which the aperture ratio is increased due to movement of the connecting block toward the source when applied to the field of display, thereby increasing the aperture ratio of the sub-pixel unit. That is, some embodiments of the present disclosure may increase the aperture ratio of the sub-pixel unit while keeping the width to length ratio of a channel the same.

It will be further noted that, in some embodiments of the present disclosure, upper edges of the first drain 311 and the second drain 313 may be in a same plane, or may not be in a same plane. In order to increase the width to length ratio of the channel of the thin film transistor as much as possible while keeping the aperture ratio the same, optionally, upper edges of the first sub-portion 311 and the third sub-portion 313 are set to be in a same plane.

Figure 4:
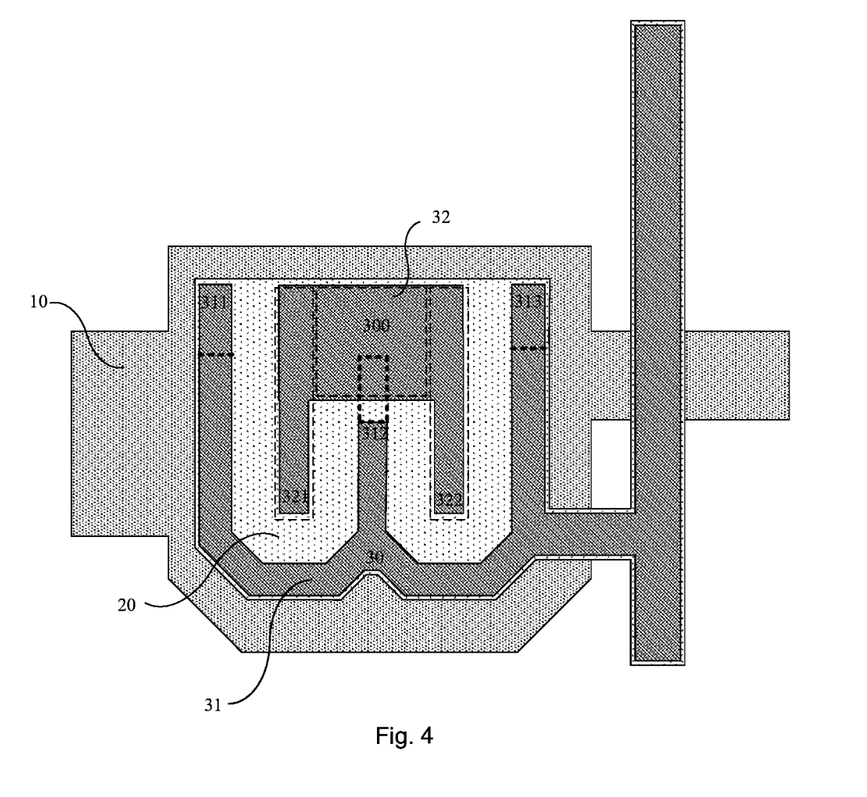
FIG. 4 is a schematic diagram showing a structure of another thin film transistor according to embodiments of the present disclosure.

In order to further increase the aperture ratio of the sub-pixel unit, optionally, as shown in FIG. 4, the connecting block 300 is entirely disposed between the first drain 321 and the second drain 322, and an upper edge of the connecting block 300 is in a same plane as upper edges of the first drain 321 and the second drain 322. That is, a projection of the connecting block 300 all falls within the gate 10.

It will be noted that, first, the upper edge of the connecting block 300 and the upper edges of the first drain 321 and the second drain 322 refer to edges of the connecting block 300, the first drain 321 and the second drain 322 on a side thereof away from the second sub-portion 312 of the source 31.

Second, it is arranged that "an upper edge of the connecting block 300 is in a same plane as upper edges of the first drain 321 and the second drain 322" to avoid that in a case where upper edges of the first drain 321 and the second drain 322 protrude beyond the upper edge of the connecting block 300, channel(s) will not be effectively formed at the first sub-portion 311 and the third sub-portion 313 of the source 31 in a region where the upper edges of the first drain 321 and the second drain 322 protrude beyond the upper edge of the connecting block 300. Moreover, the entire region where the upper edges of the first drain 321 and the second drain 322 protrude beyond the upper edge of the connecting block 300 is opaque, which is not conducive to increasing the aperture ratio of the sub-pixel.

Through specific embodiments below, it is further illustrated that compared to the TFT in the related art (e.g., FIG. 1), the TFT provided by some embodiments of the present disclosure is conducive to increasing the aperture ratio of the sub-pixel unit. For convenience of description, as shown in FIG. 1, it is assumed that the connecting block 300 in the related art—a connecting portion corresponding to the via hole 40 in the drain 32—is a square, and the square has a side length of 4H; a height of a transverse connecting sub-portion 302 that connects the connecting portion (i.e., the connecting block 300) and one of two sub-portions 301 is half of the side length of the square, that is, 2H.

As shown in FIG. 3, a portion of the connecting block 300 is disposed between the first drain 321 and the second drain 322. In order to compare the aperture ratios of the sub-pixel units in the TFT in FIG. 3 and the TFT in FIG. 1 more clearly, FIG. 5 is provided, which is a schematic diagram showing structures of the TFT in FIG. 3 and the gate and the connecting block (shown in bold dotted lines) in FIG. 1.

Figure 5:
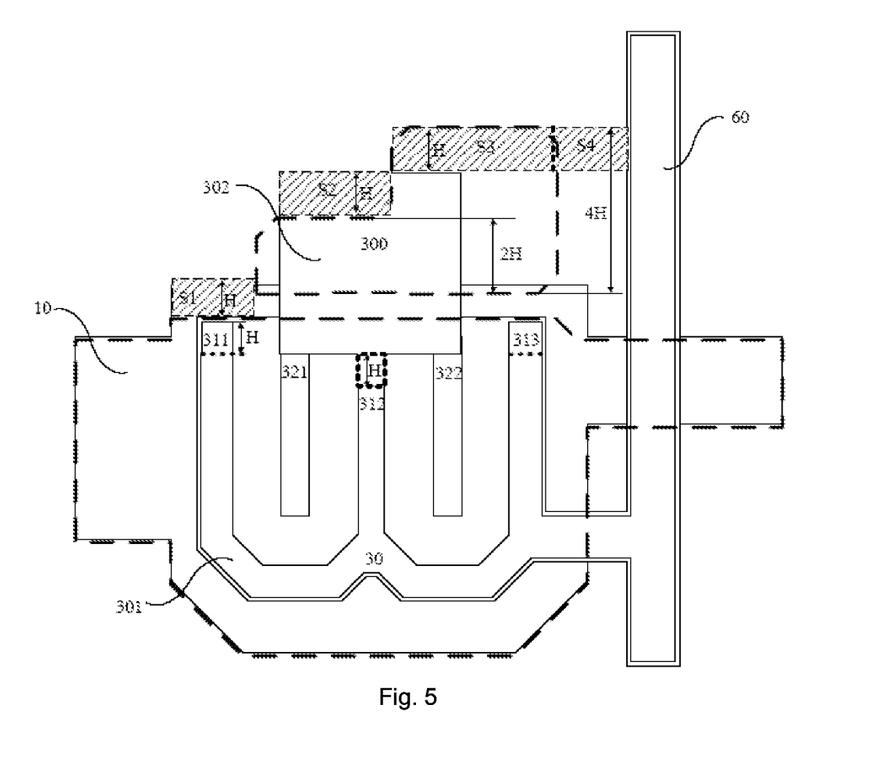
FIG. 5 is a schematic diagram showing simplified structures of the thin film transistors shown in FIGS. 1 and 3 according to embodiments of the present disclosure.

In combination with FIGS. 1 and 3, as shown in FIG. 5, it is assumed that the length of the first sub-portion 311 and the length of the third sub-portion 313 are respectively increased by H in FIG. 3 as compared to FIG. 1, and the length of the second sub-portion 312 is reduced by H in FIG. 3 as compared to in FIG. 1. Thus, compared with the TFT in FIG. 1, a channel width W is reduced by an amount the same as an amount by which the channel width W is increased in FIG. 3. That is, the channel width W is the same in FIG. 1 and FIG. 3. Therefore, in a case where a channel length L is the same, the TFT in FIG. 3 has a same width to length ratio (W/L) of a channel as the TFT in FIG. 1.

On this basis, in a case where the TFT is applied to the field of display, as shown in FIG. 5, in whether the related art or some embodiments of the present disclosure, a portion disposed between a data line 60 and a portion of the connecting block 300 disposed outside the gate 10 will be blocked by a black matrix and cannot be used for display. Thus, when calculating the aperture ratio, this portion also needs to be calculated as an opaque portion.

Comparing FIG. 1 with FIG. 3 (referring to FIG. 5), a non-display area is increased by an amount due to the lengthening of the first sub-portion 311 and the third sub-portion 313 and due to movement of the connecting block 300 toward the source 31 smaller than an amount by which the non-display area is reduced due to the movement of the connecting block 300 toward the source 31. That is, in FIG. 5, a sum of a shadow S1 and a shadow S2 is smaller than a sum of a shadow S3 and a shadow S4 (S1+S2<S3+S4). Specifically, the shadow S1 is an area brought about by the lengthening of the first sub-portion 311 and the third sub-portion 313, which causes the aperture ratio to be reduced; the shadow S2 is an area brought about by the movement of the connecting block 300 toward the source 31, which causes the aperture ratio to be reduced; the shadow S3 and the shadow S4 are areas brought about by the movement of the connecting block 300 toward the source 31, which causes the aperture ratio to be increased. The shadow S3 corresponds to a region of a portion of the connecting block 300 in FIG. 1, and the shadow S4 corresponds to a region disposed between the shadow S3 and the data line 60. In addition, in some embodiments of the present disclosure, for convenience of description, S1, S2, S3, and S4 may represent respective portions, or may directly represent an area of each portion.

Specifically, the shadow S1, the shadow S2, the shadow S3, and the shadow S4 have a same height H. In actual manufacturing, a length of the shadow S1 is close to a length of the shadow S4 (and is about ⅓ to ½ times the side length of the connecting block 300), wherein the length of the shadow S4 refers to a distance from the connecting block 300 to the data line 60. Thus, an area of the shadow S4 is close to an area of the shadow S1 (S1 S4). In addition, a length of the shadow S3 is equal to the side length of the connecting block 300, and a length of the shadow S2 is smaller than the side length of the connecting block 300. Thus, an area of the shadow S2 is smaller than an area of the shadow S3 (S2<S3). Therefore, the sum of the area of the shadow S1 and the area of the shadow S2, is smaller than the sum of the area of the shadow S3 and the area of the shadow S4, i.e., S1+S2<S3+S4. That is, the non-display area is increased by an amount due to the lengthening of the first sub-portion 311 and the third sub-portion 313 smaller than an amount by which the non-display area is reduced due to the movement of the connecting block 300 toward the source 31. Therefore, some embodiments of the present disclosure are capable of increasing the aperture ratio of the sub-pixel unit while ensuring that the width to length ratio of the channel is kept the same.

In FIG. 4, the connecting block 300 is entirely disposed between the first drain 321 and the second drain 322, and the upper edge of the connecting block 300 is in a same plane as upper edges of the first drain 321 and the second drain 322. In order to compare the aperture ratios of the sub-pixel units in the TFT in FIG. 4 and the TFT in FIG. 1 more clearly, FIG. 6 is provided, which is a schematic diagram showing structures of the TFT in FIG. 4 and the gate and the connecting block (shown in bold dotted lines) in FIG. 1.

Figure 6:
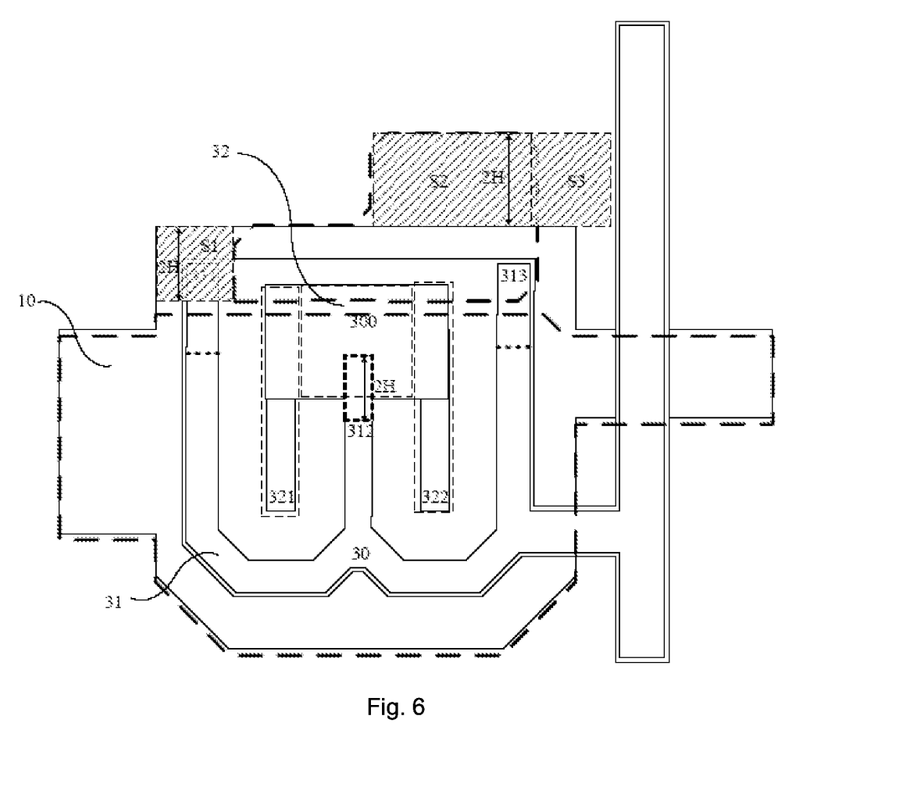
FIG. 6 is a schematic diagram showing simplified structures of the thin film transistors shown in FIGS. 1 and 4 according to embodiments of the present disclosure.

In combination with FIGS. 1 and 4, as shown in FIG. 6, in a case where the upper edge of the connecting block 300 is in a same plane as upper edges of the first drain 321 and the second drain 322, the technical solution provided by some embodiments of the present disclosure may be approximately viewed as: compared with FIG. 1, the length of the first sub-portion 311 and the length of the third sub-portion 313 are both increased by 2H (i.e., half of the side length of the connecting block 300) in FIG. 4, and the length of the second sub-portion 312 is reduced by 2H in FIG. 4, without considering a gap h (referring to FIG. 1) between the transverse connecting sub-portion 302 and the gate 10 in FIG. 1 of the related art. Thus, compared with the TFT in FIG. 1, the channel width W is reduced by an amount the same as an amount by which the channel width W is increased in FIG. 4. That is, the channel width W is the same in FIG. 1 and FIG. 4. Therefore, in a case where the channel length L is the same, the TFT in FIG. 4 has a same width to length ratio (W/L) of a channel as the TFT in FIG. 1.

In the embodiment shown in FIG. 3 above, a portion of the connecting block 300 is disposed outside the gate 10, resulting in that a portion between the portion and the data line 60 cannot be used for display (referring to FIG. 1 or FIG. 3). However, in the TFT shown in FIG. 4 in this embodiment, the connecting block 300 is entirely disposed within a region where the gate 10 is disposed.

In this case, compared with FIGS. 1 and 4 (referring to FIG. 6), the non-display area is increased by an amount, i.e. the shadow S1 in FIG. 6, due to the lengthening of the first sub-portion 311 and the third sub-portion 313, smaller than an amount, i.e. the sum of the shadow S2 and the shadow S3 in FIG. 6, by which the non-display area is reduced due to the movement of the connecting block 300 toward the source 31. That is, S1<S2+S3; wherein the shadow S2 corresponds to a region of a portion of the connecting block 300 in FIG. 1, and the shadow S3 corresponds to a region disposed between the shadow S2 and the data line 60.

Specifically, the shadow S1, the shadow S2, and the shadow S3 have a same height 2H. In actual manufacturing process, a length of the shadow S1 is close to a length of the shadow S3 (about ⅓ to ½ times the side length of the connecting block 300). That is, an area of the shadow S1 is close to an area of the shadow S3 (S1≈S3). A length of the shadow S2 is equal to the side length of the connecting block 300, and a width of the shadow S2 is 2H (i.e., half of the side length of the connecting block 300). The transverse connecting sub-portion 302 in FIG. 1 is entirely disposed within the region where the gate 10 is disposed. In this way, the area of the shadow S2 is equivalent to an area that causes the aperture ratio to be increased. That is, the non-display area is increased by an amount due to the lengthening of the first sub-portion 311 and the third sub-portion 313 smaller than an amount by which the non-display area is reduced due to the movement of the connecting block 300 toward the source 31. Therefore, some embodiments of the present disclosure are capable of increasing the aperture ratio of the sub-pixel unit while ensuring that the width to length ratio of the channel is kept the same.

In summary, compared with the embodiment shown in FIG. 3, the design scheme in this embodiment achieves an even larger aperture ratio on the basis of the aperture ratio in the related art. That is, the design scheme in this embodiment is capable of increasing the aperture ratio of the sub-pixel unit to a greater extent while ensuring that the width to length ratio of the channel is kept the same.

Figure 7:
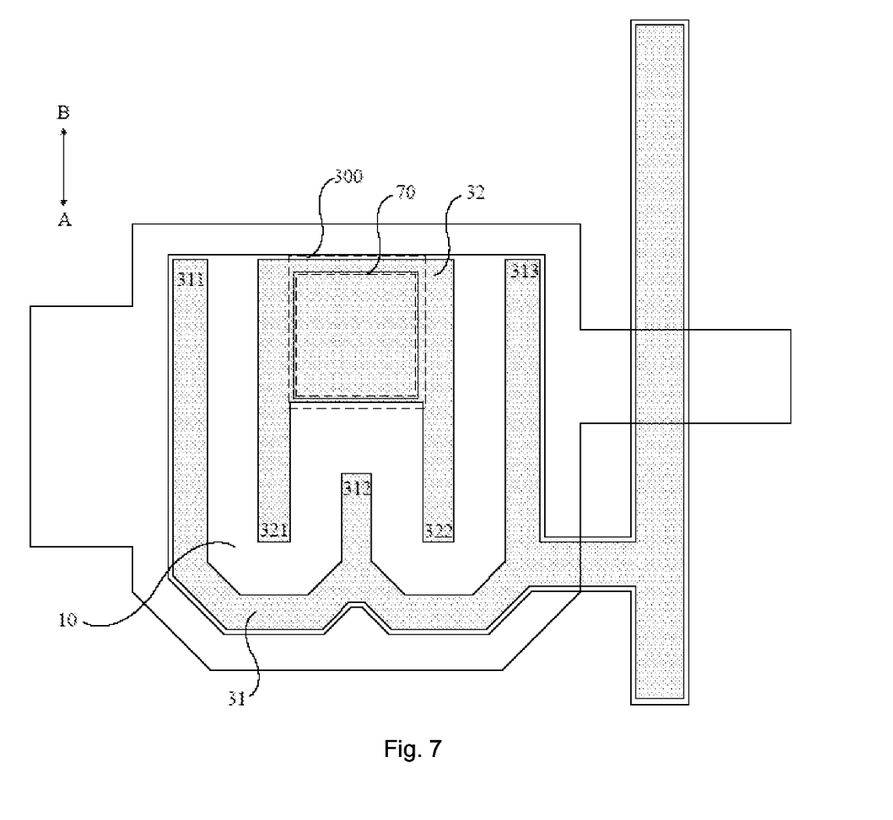
FIG. 7 is a schematic diagram showing a structure of yet another thin film transistor according to embodiments of the present disclosure.

In some embodiments of the present disclosure, referring to FIG. 4, the portion of the connecting block 300 disposed between the first drain 321 and the second drain 321 overlaps with the region where the gate 10 is disposed (projections of the connecting block 300 and the gate 10 overlap when viewing in a direction from the connecting block 300 to the gate 10, but the connecting block 300 and the gate 10 do not overlap in an actual sense). In this way, there will be a relatively large stray capacitance Co between the connecting block 300 and the gate 10. Therefore, in some embodiments of the present disclosure, in order to reduce the stray capacitance Co between the connecting block 300 and the gate 10, optionally, as shown in FIG. 7, a hollow portion 70 is provided in a region of the gate 10 corresponding to the portion of the connecting block 300 disposed between the first drain 321 and the second drain 322.

It will be noted that, some embodiments of the present disclosure do not limit a shape or size of the hollow portion 70. The hollow portion 70 may be square or rectangular, as long as it does not affecting a performance of the TFT. An area of the hollow portion 70 may be equal to, larger than, or less than an area of the portion of the connecting block 300 disposed between the first drain 321 and the second drain 322, which is not limited by some embodiments of the present disclosure.

Figure 8:
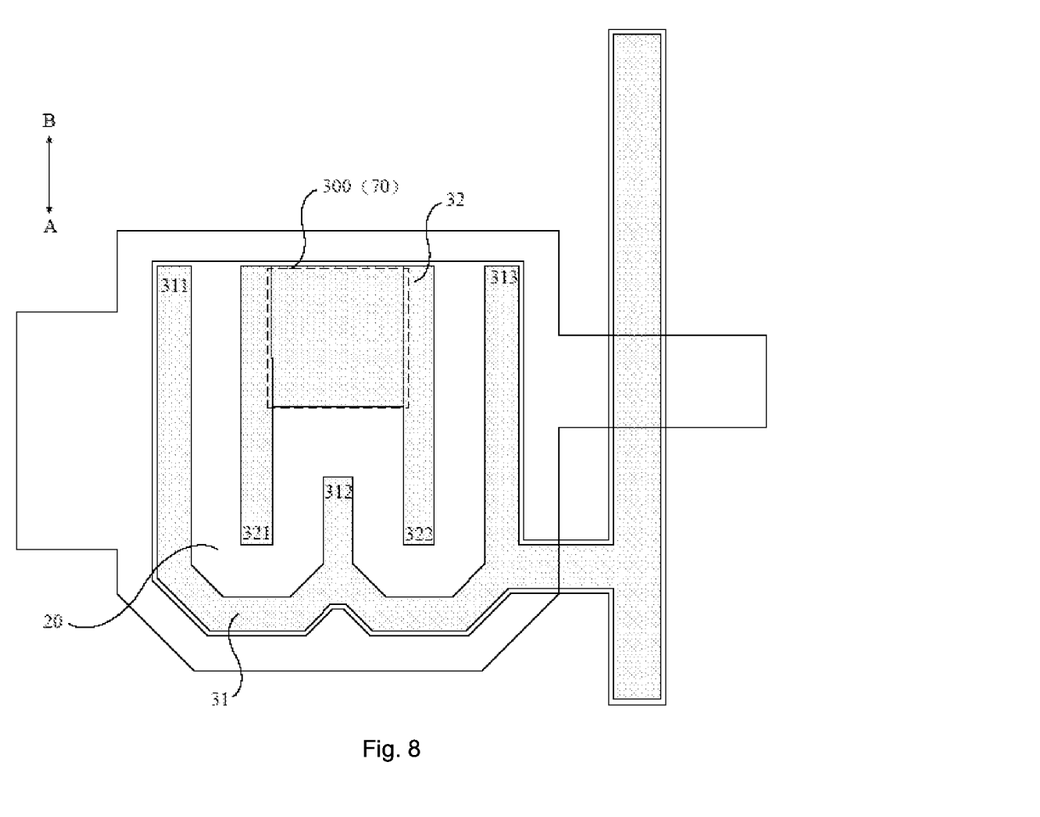
FIG. 8 is a schematic diagram showing a structure of yet another thin film transistor according to embodiments of the present disclosure.

Of course, in order to minimize the stray capacitance Co, as shown in FIG. 8, optionally, on any surface of the gate 10, in a direction that is perpendicular to the direction from the first end A to the second end B, a size of the hollow portion 70 is equal to, or approximately equal to a distance between a projection of the first drain 321 and a projection of the second drain 322 on the surface in the direction; and/or, in a direction from the first end A to the second end B, a size of the hollow portion 70 is equal to, or approximately equal to a size of a projection of the portion of the connecting block 300 disposed between the first drain 321 and the second drain 322 on the surface in the direction. For example, in FIG. 8, the hollow portion 70 and the connecting block 300 have the exact same shape and size, and their positions are completely overlapped.

Figure 9:
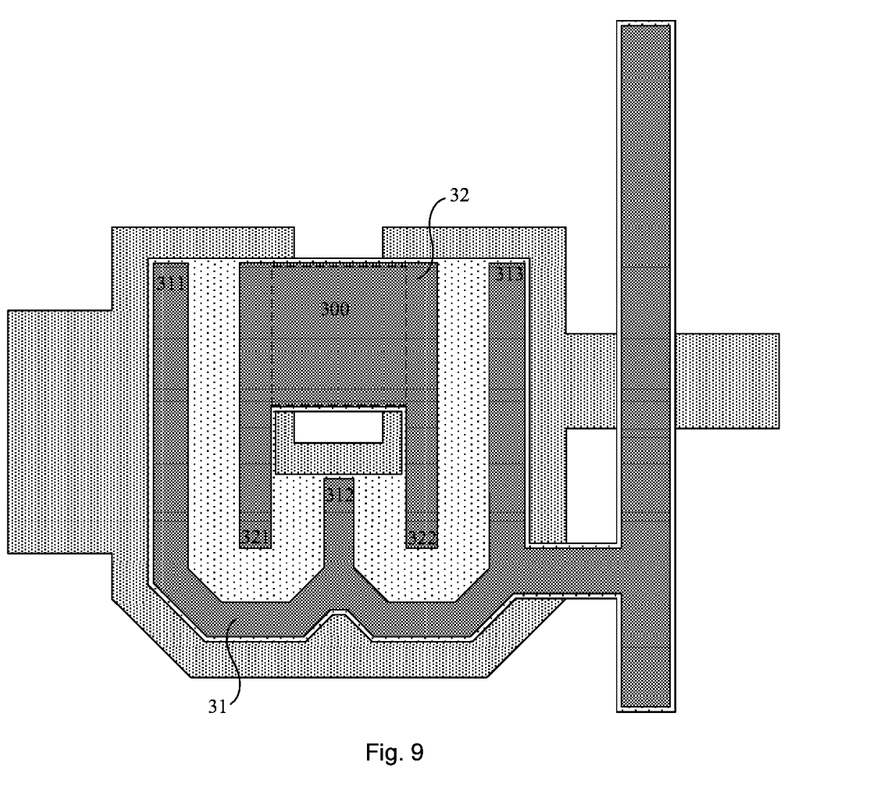
FIG. 9 is a schematic diagram showing a structure of yet another thin film transistor according to embodiments of the present disclosure.

In a case where the drain 32 is offset in the direction from the first end A to the second end B due to process fluctuations, an overlapping area of the drain 32 and the gate 10 may be changed, thereby causing the stray capacitance Co to become unstable and bring adverse effects. To avoid this situation, as shown in FIG. 9, in a case where the connecting block 300 is entirely disposed between the first drain 321 and the second drain 322, and an upper edge of the connecting block 300 is in a same plane as upper edges of the first drain 321 and the second drain 322, on any surface of the gate 10, in the direction from the first end A to the second end B, an upper edge of the hollow portion 70 extends beyond an upper edge of a projection of the connecting block 300 on the surface, and a lower edge of the hollow portion 70 extends beyond a lower edge of the projection of the connecting block 300 on the surface. In this way, even if the drain 32 is slightly offset in the direction from the first end A to the second end B due to process fluctuations, the overlapping area between the drain 32 and the gate 10 may remain unchanged, so that there is a relatively stable stray capacitance Co between the drain 32 and the gate 10.

On this basis, in order to facilitate the fabrication process, optionally, as shown in FIG. 9, the hollow portion 70 is a gap disposed in a side of the gate 10 close to the upper edge of the projection of the connecting block 300 on the gate 10.

It will be noted that, in a case where the lower edge of the hollow portion 70 extends beyond the lower edge of the projection of the connecting block 300 on the gate 10, as shown in FIG. 9, in order to avoid a situation that the source 31 is offset in the direction from the first end A to the second end B due to process fluctuations, and as a result a projection of an upper edge of the second sub-portion 312 extends into the hollow portion 70, in an actual manufacturing process, a certain distance is generally reserved between the hollow portion 70 and a position of the gate 10 corresponding to the upper edge of the second sub-portion 312.

Further, in order to simplify the fabrication process and reduce manufacturing cost, in some embodiments of the present disclosure, optionally, as shown in FIGS. 3 to 8, projections of the source 31 and the drain 32 both fall within the active layer 20. In this way, the source 31, the drain 32 and the active layer 20 may be formed using a half tone process through a single patterning process (that is, using a single mask) and two etching processes. Of course, the source 31, the drain 32 and the active layer 20 may also be formed separately through two patterning processes (that is, using two masks), which is not limited by some embodiments of the present disclosure.

Figure 10:
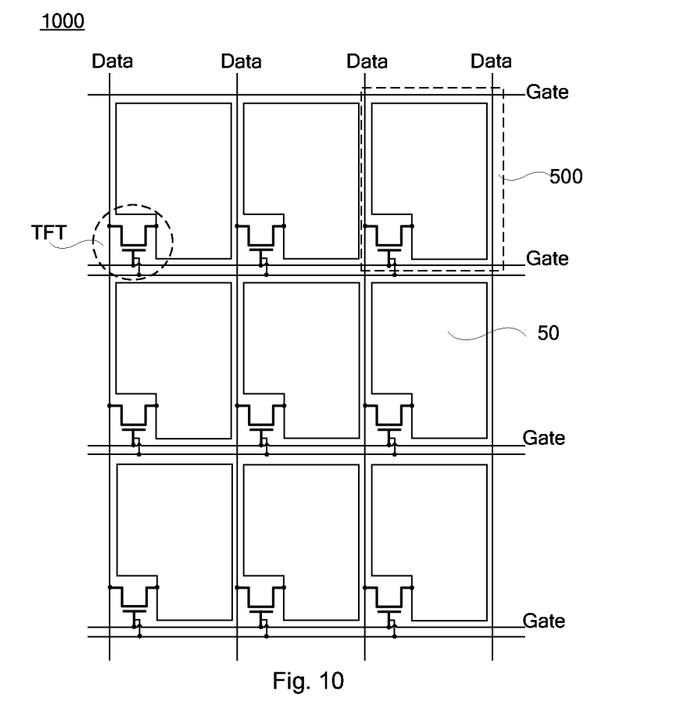
FIG. 10 is a schematic diagram showing a structure of an array substrate according to embodiments of the present disclosure.
Figure 11:
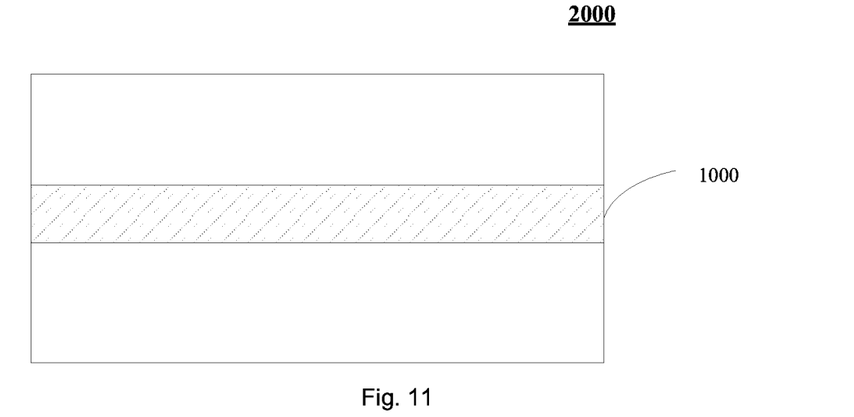
FIG. 11 is a schematic diagram showing a structure of a display device according to embodiments of the present disclosure.

Some embodiments of the present disclosure further provide an array substrate 1000. As shown in FIG. 10, the array substrate includes a plurality of sub-pixels 500 that are arranged in an array and defined by a plurality of data lines and a plurality of gate lines that are crisscrossed. Each of the plurality of sub-pixels 500 includes a pixel electrode 50 and the thin film transistor described above. The pixel electrode 50 is connected to the connecting block 300 of the thin film transistor through a via hole 40. The thin film transistor in the array substrate has the same structure and beneficial effects as those of the thin film transistor provided in the above embodiments. Since the structure and beneficial effects of the thin film transistor have been described in detail in the above embodiments, they will not be described again.

It will be noted that, in the embodiments of the present disclosure, the array substrate above may be of an Advanced-Super Dimensional Switching (ADS) type, an In Plane Switch (IPS) type or a Twist Nematic (TN) type, which is not limited by some embodiments of the present disclosure.

Embodiments of the present disclosure further provide a display device 2000 which, as shown in FIG. 10, includes the array substrate 1000 described above. Similarly, the thin film transistor in the display device has the same structure and beneficial effects as those of the thin film transistor provided in the above embodiments. Since the structure and beneficial effects of the thin film transistor have been described in detail in the above embodiments, they will not be described again.

It will be noted that, in some embodiments of the present disclosure, the display device specifically includes at least a liquid crystal display panel. The display panel can be applied, for example, to any product or component having a display function such as a liquid crystal display, a liquid crystal television, a digital photo frame, a mobile phone or a tablet computer.

The foregoing descriptions are merely some implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A thin film transistor, comprising:
   a gate;
   an active layer;
   a source including a connecting portion, and a first sub-portion, a second sub-portion, and a third sub-portion that are arranged sequentially, wherein at first ends of the first, second, and third sub-portions, the connecting portion is connected to the first sub-portion, the second sub-portion, and the third sub-portion to form two recesses adjacent to each other, and wherein a distance from a second end of the second sub-portion to the connecting portion is smaller than a distance from an second end of the first sub-portion to the connecting portion and a distance from an second end of the third sub-portion to the connecting portion; and
   a drain including a connecting block, and a first drain and a second drain disposed in the two recesses respectively, wherein at least a portion of the connecting block is disposed between the first drain and the second drain, and is connected to the first drain and the second drain.

2. The thin film transistor according to claim 1, wherein the connecting block is entirely disposed between the first drain and the second drain, and an edge of the connecting block facing away from the connecting portion is in a same plane as edges of the first drain and the second drain facing away from the connecting portion.

3. The thin film transistor according to claim 1, wherein the gate has a hollow portion, and the hollow portion corresponds to the portion of the connecting block disposed between the first drain and the second drain.

4. The thin film transistor according to claim 3, wherein in a plane parallel to any surface of the gate, in a direction that is perpendicular to a direction from one of the first ends to a corresponding second end, a size of the hollow portion is equal to a distance between an orthographic projection of the first drain and an orthographic projection of the second drain on the surface.

5. The thin film transistor according to claim 3, wherein in a direction from one of the first ends to a corresponding second end, a size of the hollow portion is equal to a size of the portion of the connecting block disposed between the first drain and the second drain in the direction.

6. The thin film transistor according to claim 3, wherein the connecting block is entirely disposed between the first drain and the second drain, and an edge of the connecting block facing away from the connecting portion is in a same plane as edges of the first drain and the second drain facing away from the connection portion; in a direction from one of the first ends to a corresponding second end, an edge of the hollow portion facing away from the connecting portion extends beyond the edge of the connecting block facing away from the connecting portion, and an edge of the hollow portion close to the connecting portion extends beyond an edge of the connecting block close to the connection portion.

7. The thin film transistor according to claim 6, wherein the hollow portion is a gap disposed in a side of the gate close to the edge of the connecting block facing away from the connecting portion.

8. The thin film transistor according to claim 1, wherein orthographic projections of the source and the drain on a plane where the active layer is located are within a range of the active layer.

9. An array substrate, comprising sub-pixels arranged in an array, each sub-pixel including a pixel electrode and the thin film transistor according to claim 1, the pixel electrode being connected to the connecting block of the thin film transistor.

10. A display device, comprising the array substrate according to claim 9.

11. The thin film transistor according to claim 1, wherein a size of a portion of the connecting block that is not disposed between the first drain and the second drain in a direction perpendicular to a direction from one of the first ends to a corresponding second end is equal to a distance between a side of the first drain facing the second drain and a side of the second drain facing the first drain.

12. The thin film transistor according to claim 11, wherein a size of a portion of the connecting block that is not disposed between the first drain and the second drain in a direction perpendicular to a direction from one of the first ends to a corresponding second end is equal to a distance between a side of the first drain facing away from the second drain and a side of the second drain facing away from the first drain.

13. A method for manufacturing the thin film transistor according to claim 1, the method comprising:
   forming a gate;
   forming an active layer;
   forming a source which includes a connecting portion, and a first sub-portion, a second sub-portion, and a third sub-portion that are arranged sequentially, wherein at first ends of the first, second, and third sub-portions, the connecting portion is connected to the first sub-portion, the second sub-portion, and the third sub-portion to form two recesses adjacent to each other, and wherein a distance from a second end of the second sub-portion to the connecting portion is smaller than a distance from an second end of the first sub-portion to the connecting portion and a distance from an second end of the third sub-portion to the connecting portion; and
   forming a drain which includes a connecting block, and a first drain and a second drain disposed in the two recesses respectively, wherein at least a portion of the connecting block is disposed between the first drain and the second drain, and is connected to the first drain and the second drain.

14. The method for manufacturing the thin film transistor according to claim 13, wherein
   the source, the drain and the active layer are formed by using a half tone process through a single patterning process and two etching processes.

15. The method for manufacturing the thin film transistor according to claim 13, wherein
   the source, the drain and the active layer are formed separately through two patterning processes.

16. The method for manufacturing the thin film transistor according to claim 13, wherein
   the gate has a hollow portion and the hollow portion corresponds to the portion of the connecting block disposed between the first drain and the second drain; and a certain distance is reserved between the hollow portion and a position of the gate corresponding to an edge of the second sub-portion facing away from the connecting portion.

* * * * *

UNITED STATES PATENT AND TRADEMARK OFFICE
CERTIFICATE OF CORRECTION

PATENT NO. : 10,720,531 B2
APPLICATION NO. : 16/345204
DATED : July 21, 2020
INVENTOR(S) : Keke Gu et al.

Page 1 of 1

It is certified that error appears in the above-identified patent and that said Letters Patent is hereby corrected as shown below:

In the Specification

Column 7, Line 53, "(S1 S4)" should be changed to -- (S1 ≈ S4) --.

Column 9, Line 18, "Co" should be changed to -- $C_{gd}$ --.

Column 9, Line 21, "Co" should be changed to -- $C_{gd}$ --.

Column 9, Line 35, "Co" should be changed to -- $C_{gd}$ --.

Column 9, Line 53, "Co" should be changed to -- $C_{gd}$ --.

Column 10, Line 3, "Co" should be changed to -- $C_{gd}$ --.

Signed and Sealed this
Eighth Day of December, 2020

Andrei Iancu
*Director of the United States Patent and Trademark Office*